US 9,608,655 B1

United States Patent
Li et al.

(10) Patent No.: US 9,608,655 B1
(45) Date of Patent: Mar. 28, 2017

(54) ADC BACKGROUND CALIBRATION WITH DUAL CONVERSIONS

(71) Applicant: Analog Devices, Inc., Norwood, MA (US)

(72) Inventors: Hongxing Li, Andover, MA (US); Junhua Shen, Wilmington, MA (US); Michael Mueck, Andover, MA (US); Michael C. W. Coln, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/170,051

(22) Filed: Jun. 1, 2016

Related U.S. Application Data

(63) Continuation-in-part of application No. 15/019,381, filed on Feb. 9, 2016.

(51) Int. Cl.
 *H03M 1/10* (2006.01)
 *H03M 1/06* (2006.01)
 *H03M 1/14* (2006.01)
 *H03M 1/12* (2006.01)
 *H03M 1/46* (2006.01)

(52) U.S. Cl.
 CPC ......... *H03M 1/1009* (2013.01); *H03M 1/069* (2013.01); *H03M 1/124* (2013.01); *H03M 1/145* (2013.01); *H03M 1/466* (2013.01)

(58) Field of Classification Search
 None
 See application file for complete search history.

(56) References Cited

U.S. PATENT DOCUMENTS

| | | | |
|---|---|---|---|
| 4,641,129 | A | 2/1987 | Doluca et al. |
| 5,006,854 | A | 4/1991 | White et al. |
| 6,894,627 | B2 | 5/2005 | Janakiraman et al. |
| 7,006,028 | B2 | 2/2006 | Galton |

(Continued)

OTHER PUBLICATIONS

Chiu et al., Digital Calibration of SAR ADC, Proceeding of the 10th Internation Converence on Sampling Theory and Applications (SampTA 2013), http://www.eurasip.org/Proceedings/Ext/SampTA2013/papers/p544-chiu.pdf, Jul. 2013.*

(Continued)

*Primary Examiner* — Howard Williams
(74) *Attorney, Agent, or Firm* — Schwegman Lundberg & Woessner, P.A.

(57) ABSTRACT

An analog-to-digital converter (ADC) system can sample an input voltage for at least a first conversion into a first $N_1$-bit digital value and to use the same input voltage sample for at least a second conversion into a second $N_2$-bit digital value. A difference between a result of the first conversion and a result of the second conversion can be driven toward zero to adjust weights of one or more of the bits to calibrated values for use in one or more subsequent analog-to-digital conversions of subsequent samples of the input voltage. Shuffling, dithering, or the like can help ensure that at least a portion of the decision paths used in the second conversion are different from the decision paths used in the first conversion. Calibration can be performed in the background while the the ADC is converting in a normal mode of operation.

28 Claims, 11 Drawing Sheets

(56) References Cited

U.S. PATENT DOCUMENTS

| | | | |
|---|---|---|---|
| 7,312,734 | B2 | 12/2007 | McNeill et al. |
| 7,609,184 | B2 | 10/2009 | Kuramochi et al. |
| 8,587,466 | B2 | 11/2013 | Debnath et al. |
| 8,653,998 | B2 | 2/2014 | Haneda et al. |
| 8,766,839 | B2 | 7/2014 | Janakiraman et al. |
| 9,054,727 | B2 | 6/2015 | Steensgaard-Madsen |
| 9,362,937 | B1 * | 6/2016 | Burgio et al. ......... H03M 1/802 |

OTHER PUBLICATIONS

"U.S. Appl. No. 15/019,381, Non Final Office Action mailed May 27, 2016", 9 pgs.

"Digital Calibration of SAR ADC", Proceeding of the 10th Internation Converence on Sampling Theory and Applications (SarnpTA 2013), [Online] retrieved from the internet:http://www.eurasip.org/Proceedings/Ext/SampTA2013/papers/p544-chiu.pdf,, (Jul. 2013).

Hong, Hyeok-Ki, et al., "A 2.6b/cycle-Architecture-Based 10b 1.7GS/s 15.4mW 4x-Time-Interleaved SAR ADC with a Multistep Hardware-Retirement Technique", ISSCC 2015 / Session 26, (2015), 3 pgs.

Kapusta, Ron, et al., "A 14b 80 MS/s SAR ADC With 73.6 dB SNDR in 65 nm CMOS", IEEE Journal of Solid-State Circuits, vol. 48, No. 12, (Dec. 2013), 8 pgs.

Liu, Chun-Cheng, et al., "A 10b 100MS/s, 1.13mW SAR ADC with Binary-Scaled Error Compensation", ISSCC 2010 / Session 21, (2010), 3 pgs.

Liu, Wenbo, et al., "A 12-bit, 45-MS/s, 3-m W Redundant Successive-Approximation-Register Analog-to-Digital Converter With Digital Calibration", IEEE Journal of Solid State Circuits, vol. 46, No. 11, (Nov. 2011), 2661-2672.

Wang, et al., "IRD Digital Background Calibration of SAR ADC With Coarse Reference ADC Acceleration", IEEE Transactions on Circuits and Systems—II: Express Briefs, vol. 61, No. 1,, (Jan. 2014).

* cited by examiner

ADC BACKGROUND CALIBRATION WITH DUAL CONVERSIONS

CLAIM OF PRIORITY

This patent application is a continuation-in-part of U.S. patent application Ser. No. 15/019,381 entitled ADC BACKGROUND CALIBRATION WITH DUAL CONVERSIONS, filed Feb. 9, 2016, the benefit of priority of which is claimed herein, and which is incorporated herein by reference in its entirety.

BACKGROUND

Electronic systems can include analog-to-digital (A/D) converters (ADCs). Converting analog signals to digital quantities allow processors in electronic systems to perform signal processing functions for the systems. Performance of ADC circuits can depend on environmental conditions such as temperature and on variations that can occur during manufacturing. A higher accuracy ADC circuit (e.g., the number of bits of the ADC circuit is twelve or greater) may need calibration multiple times during its working life to avoid bit weight errors. The present inventors have recognized a need for improved calibration of ADCs.

OVERVIEW

This document relates generally to analog-to-digital converter (ADC) circuits, and in particular to calibration of ADC circuits.

An example of an analog-to-digital conversion system can include a sampling circuit. The sampling circuit can be configured to sample an input voltage for a first conversion into an $N_1$-bit first digital value and to use the same input voltage sample for at least a second conversion into an $N_2$-bit second digital value. $N_1$ and $N_2$ are positive integers. The analog-to-digital conversion system can include an analog-to-digital converter (ADC) circuit. The ADC circuit can include weighted circuit components providing corresponding decision paths. The ADC circuit can include a comparator circuit that can be configured to use at least some of the weighted circuit components to compare a signal based upon the sampled input voltage as part of a bit determination for determining bits of the first and second digital values. The ADC circuit can include logic circuitry that can be configured to control at least some of the decision paths used in the second conversion to be different from the decision paths used in the first conversion. In an example, at least some of the weighted circuit components and decision paths of the $N_1$-bit values of the first conversion can be shuffled from the weighted circuit components and decision paths used to convert the $N_2$-bit values of the second conversion. In an example, the logic circuitry can include a digital engine that can be configured to drive a difference between a result of the first conversion and a result of the second conversion toward zero (or a finite DC value) such as by adjusting weights of one or more of the weighted circuit components to calibrated values such as for use in one or more subsequent analog-to-digital conversions of subsequent samples of the input voltage. There are advantages to performing two or more conversions of the same sampled input voltage such as will be described subsequently, in contrast to performing only one conversion for one sampled voltage.

An example of an analog-to-digital conversion system can include a sampling circuit, such as can be configured to sample an input voltage for a first conversion into a first digital value and to use the same input voltage sample for at least a second conversion into a second digital value. The analog-to-digital conversion system can include an analog-to-digital converter (ADC) circuit. The ADC circuit can include a first-stage ADC circuit, such as can be configured to receive the sampled input voltage and to initiate a first-stage analog-to-digital conversion, using at least L bit determinations, of L most significant bits (MSBs). The ADC circuit can include at least one second-stage ADC circuit, such as can be configured to receive at least one residue voltage, remaining from the first-stage analog-to-digital conversion, from the first-stage ADC circuit, and to perform at least two second-stage analog-to-digital conversions, each using at least one different configuration during bit determinations in the respective at least two second-stage analog-to-digital conversions to calibrate the analog-to-digital converter circuit.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
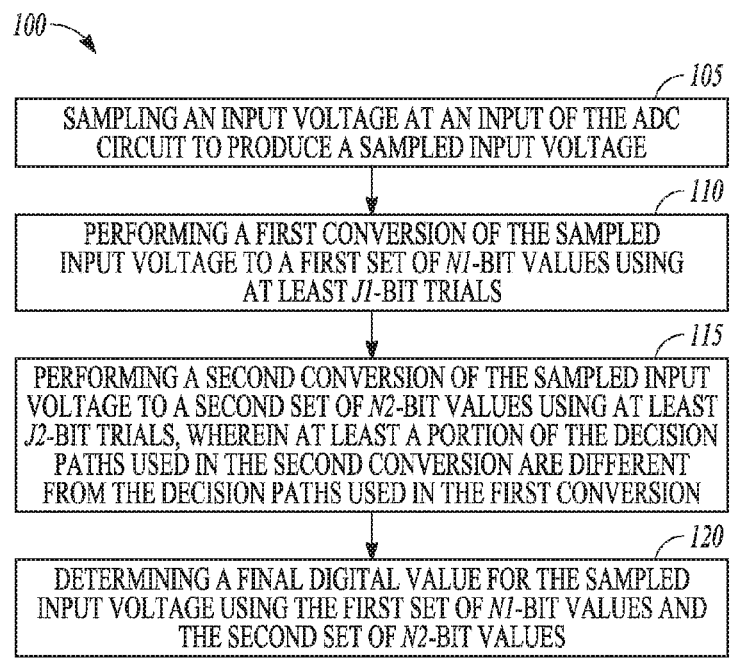
FIG. 1 is a diagram of operating an analog-to-digital converter (ADC) circuit.

As explained previously herein, higher accuracy ADCs may need repeated calibration. In general, there are two types of ADC calibration: foreground calibration and background calibration. Foreground calibrations are usually done at factory test or at chip power up, or at any other chosen time slots dedicated for the ADC calibration. In an example of foreground calibration, an accurate sinewave signal is fed into the ADC input and all the associated ADC bit weights are calibrated using the accurate sinewave signal. In another example, the lower bits of the ADC are used as a reference to measure and calibrate the bit weights of the most significant bits (MSBs) of the ADC. The downside of foreground calibration is that it doesn't track chip supply and temperature changes when performed only at the factory, Also, it may involve extra manufacturing test cost and it may be necessary to interrupt the operation of the ADC to perform calibration during use in the field.

In comparison, background calibration works in the background and can be transparent to the normal ADC operation during which analog-to-digital signal conversions is ongoing. Also, because background calibration works in the background of normal operation, it may track the effects of supply and temperature on the ADC bit weights.

One approach of background calibration is to use one or more redundant ADC channels. One of the ADC channels is used during normal operation, while at least one of the unused ADC channels is calibrated. The used ADC can be swapped out for the ADC that was calibrated, and the ADC channels can continue to be swapped out until all the ADC channels are calibrated. The downside of most such background calibration methods can include one or both of high analog/digital circuit complexity and long convergence time.

Another approach is to split one ADC into two ADCs and use both ADCs to convert the input signal. The two ADCs use redundant bits in their conversions and each conversion takes a different path to reach the output decisions. Ideally the output of the two ADCs would be the same since they have the same input, so the difference between the two ADC outputs can be processed to numerically search for the actual bit weights until the difference is minimum or near zero. For a split ADC, each 16 bit ADC has 16 bit weights to be calibrated, so there are a total 32 unknown bit weights from the two ADCs forming the split ADC. If there are 32 random input voltages and each ADC takes a randomized or pseudo-randomized path to reach its decision for each random input, then there are 32 equations for the bit weights:

Bit_adc1_vin1[15:0]*Weight_adc1[15:0]−
  Bit_adc2_vin1[15:0]*Weight_adc2[15:0]=0

Bit_adc1_vin2[15:0]*Weight_adc1[15:0]−
  Bit_adc2_vin2[15:0]*Weight_adc2[15:0]= . . .

Bit_adc1_vin32[15:0]*Weight_adc1[15:0]−
  Bit_adc2_vin32[15:0]*Weight_adc2 [15:0]=0.

Bit_adc1_vinn represents the ADC1 output bits corresponding to input vinn, and Weight_adc1 refers to the ADC1 bit weights to be calibrated. Assuming all the 32 equations are uncorrelated, the matrix can be solved to obtain the 32 actual bit weights in the two ADCs, or numerical methods can be used to solve the 32 unknown bit weights. For instance, the two different ADC outputs can be fed to a least mean square (LMS) loop configured to drive down the conversion error toward zero or a specified fixed value while determining the final 32 ADC bit weights. Because the calibration process is deterministic, the numerical method approach should converge quickly. The equations are usually uncorrelated as long as the two ADCs take different paths in the conversions, In the case wherein the equations are correlated, more than 32 input voltage samples may be needed. In a practical implementation where there is noise, many more samples may be needed in order to average out the effect of the noise.

While the split ADC approach improves the convergence time, the split ADC approach still includes high digital processing complexity, increased circuit area, and increased power overhead. An improvement to the split ADC approach is to use two half ADCs to achieve the same noise performance by averaging the two ADC outputs while using only half the power and area. Practically however, the overhead of area and power is still significant due to block scaling inefficiency, routing overhead, etc. Additionally, the two ADCs may couple to each other during operation, which potentially degrades performance. Another approach is to use one ADC with multiple (e.g., dual) conversions to enable the background calibration.

FIG. 1 is a diagram of an example of a method 100 of operating an ADC circuit. The ADC circuit can be a successive approximation ADC, a pipeline ADC, or a flash ADC. At 105, the ADC circuit samples an input voltage at an input of the ADC circuit to produce a sampled input voltage. At 110, the ADC circuit performs a first conversion of the sampled input voltage to a first set of $N_1$-bit values using $j_1$ bit trials, where $N_1$ and $j_1$ are positive integers. In certain examples, the ADC circuit is a high accuracy ADC circuit with $N_1$ greater than or equal to twelve. In certain examples, the number of bits $N_1$ of the ADC circuit is sixteen. In some instances, e.g., using redundant bits, $j_1 > N_1$. In some instances, such as where multiple bits can be determined using a single bit trial, $N_1 > j_1$.

At 115, the ADC circuit performs a second conversion, e.g., immediately after the first conversion, of the same sampled input voltage used in the first conversion to generate a second set of $N_2$-bit values. At least a portion of the bit trial decision paths used in the second conversion can be made different from the decision paths used in the first conversion, such as by applying a dither, a shuffling, or other technique such as explained further herein.

At 120, a final N-bit digital value for the sampled input voltage is determined using the first set of $N_1$-bit values and the second set of $N_2$-bit values. The raw decision bits can be collected from both of the first and second conversions and fed into a digital engine. The digital engine takes raw ADC output bits and drives the difference of the output of the two conversion toward zero (or a specific finite value) while adjusting the weights of the N-bits to get the actual calibrated bit weights for the ADC circuit. An illustrative example of calibrating a split ADC architecture is described in U.S. Pat. No. 7,312,734 to John A. McNeill and Michael C. Coln, entitled CALIBRATABLE ANALOG-TO-DIGITAL CONVERTER SYSTEM, which is assigned to Analog Devices, Inc., and which is incorporated herein by reference in its entirety, including is calibration description.

Figure 2:
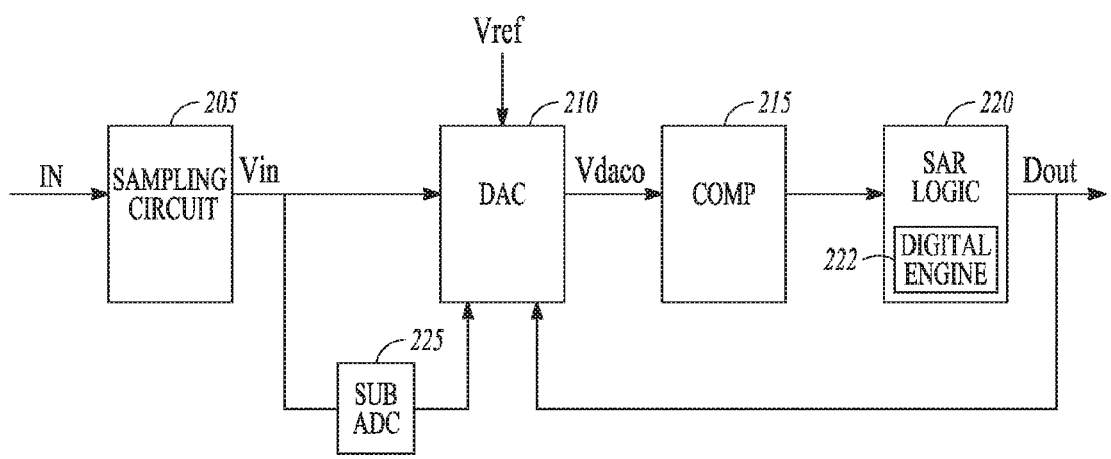
FIG. 2. is a functional block diagram of an example of a successive approximation register ADC circuit.

FIG. 2 is a functional block diagram of an example of an N-bit successive approximation register (SAR) ADC circuit 200. The SAR ADC circuit can include a digital-to-analog converter (DAC) circuit 210, a sampling circuit 205 that can be included in the DAC circuit 210, a comparator circuit 215, and logic circuitry 220. The DAC circuit 210 can include at least N weighted circuit components, such as in which the weight (e.g., capacitance value) of a particular weighted circuit component can be specified relative to that of one or more other weighted circuit components, with N being a positive integer. In certain examples, N is equal to sixteen and the weighted circuit components include sixteen capacitors (for example, with the sixteen capacitors including different multiples of a specified unit capacitor to obtain the weighting relative to each other). The sampling circuit 205 can sample an input voltage at an input to the ADC circuit and can hold a sampled voltage for comparison to another voltage using the weighted circuit components.

An output voltage of the DAC circuit 210 (Vdaco) can be compared to the sampled and held voltage, such as using a comparator circuit 215. The bit values of the DAC circuit 210 can be adjusted, such as based on the output of the comparator circuit 215. The conversion may start with the DAC set to midscale, in an example. The comparator 215 can determine whether the DAC output is greater or less than the sampled input voltage, and the comparison result can be stored as a one or zero for that bit of the DAC. Conversion then proceeds to the next bit value until all bits of the digital value are determined. One iteration of changing the DAC output and comparing the voltage to the input voltage can be referred to as a bit trial or a bit determination.

The SAR logic circuitry 220 can control the ADC operation, such as during the bit trials. The SAR logic circuitry 220 initiates one sample of the input voltage, initiates the first conversion of the sampled input voltage to a first set of bit values, such as using a first set of bit trials, and initiates a second conversion of the sampled input voltage to a second set of bit values, such as using a second set of bit trials. The logic circuitry can include a digital engine 222 to perform functions such as progressing the ADC through different states of operation and to perform the calculations described. As in the method of FIG. 1, at least a portion of the bit trial decision paths used in the second conversion can be made different from the decision paths used in the first conversion, e.g., by shuffling, dithering, or the like, such that different component values or conversion comparison criteria can be used between the first and second conversions. The logic circuitry 220 can determine the final N-bit digital value for the sampled input voltage using the first set of bit values and the second set of bit values, and the final N-bit digital value can be made available at output Dout.

The SAR ADC can include a sub-ADC 225 to solve k MSBs of the N-bit values, where k is a positive integer greater than or equal to one and less than N($1 \leq k < N$). The sub-ADC may limit the DAC output swing and resolve the first few MSBs quickly to potentially improve overall SAR ADC efficiency.

Figure 3:
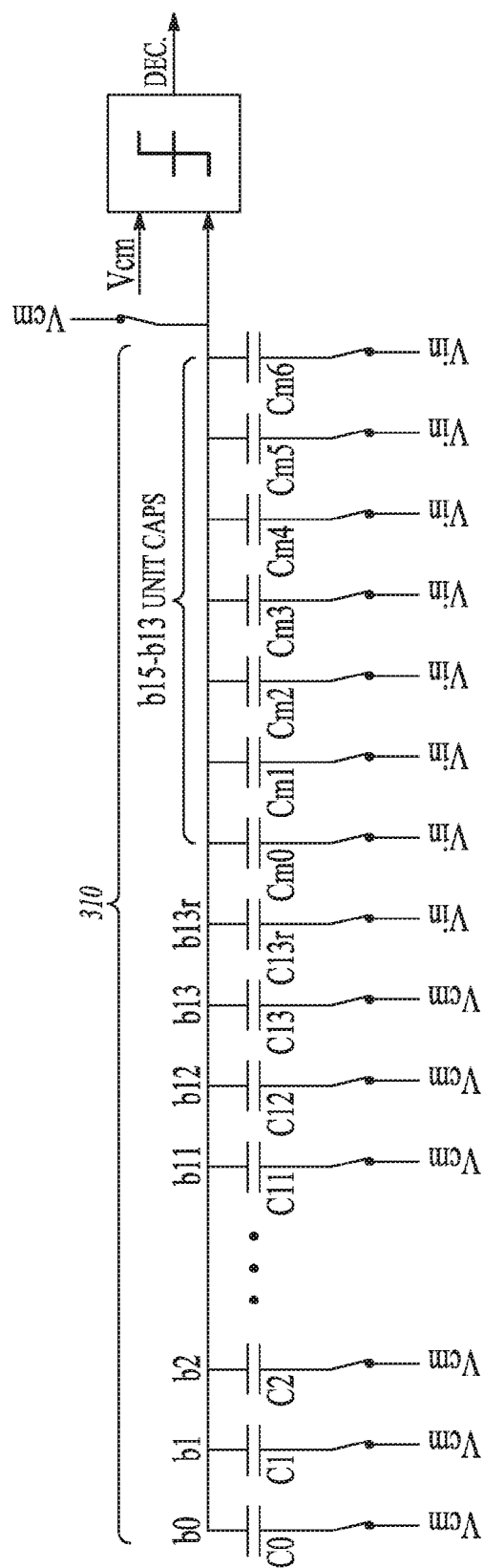
FIG. 3 is a circuit diagram of portions of an example of a digital-to-analog converter (DAC) circuit for an ADC.

FIG. 3 is a circuit diagram of portions of an example of a DAC circuit 310 for a sixteen bit SAR ADC (N=16) with three MSBs (k=3) of the DAC (bits b15-b13) resolved by a sub-ADC, in this example. The SAR ADC can include at least one redundant bit and, in the example shown, the SAR ADC includes a redundant bit for bit b13 labeled b13r. Redundancy can be used in an ADC to tolerate earlier decision errors and, in this case, it is used to enable multiple different decision paths to reach the same decision, for the same ADC input.

In the example of FIG. 3, a capacitor array of the SAR DAC is shown as configured in the sampling phase of the SAR ADC. The sub-ADC can output the MSB decisions, such as using thermometer encoding, and the three MSBs (b15-b13) of the DAC circuit are shown thermometer encoded using capacitors Cm6-Cm0. The input voltage can be sampled using the weighted capacitors of all of bits b15-b13 as well as b13r. The seven MSB capacitors are unit capacitors that are nominally of the unit capacitance value C13, but they can he intentionally sized slightly differently to provide different decision paths for the two DAC conversions such as described below.

Figure 4:
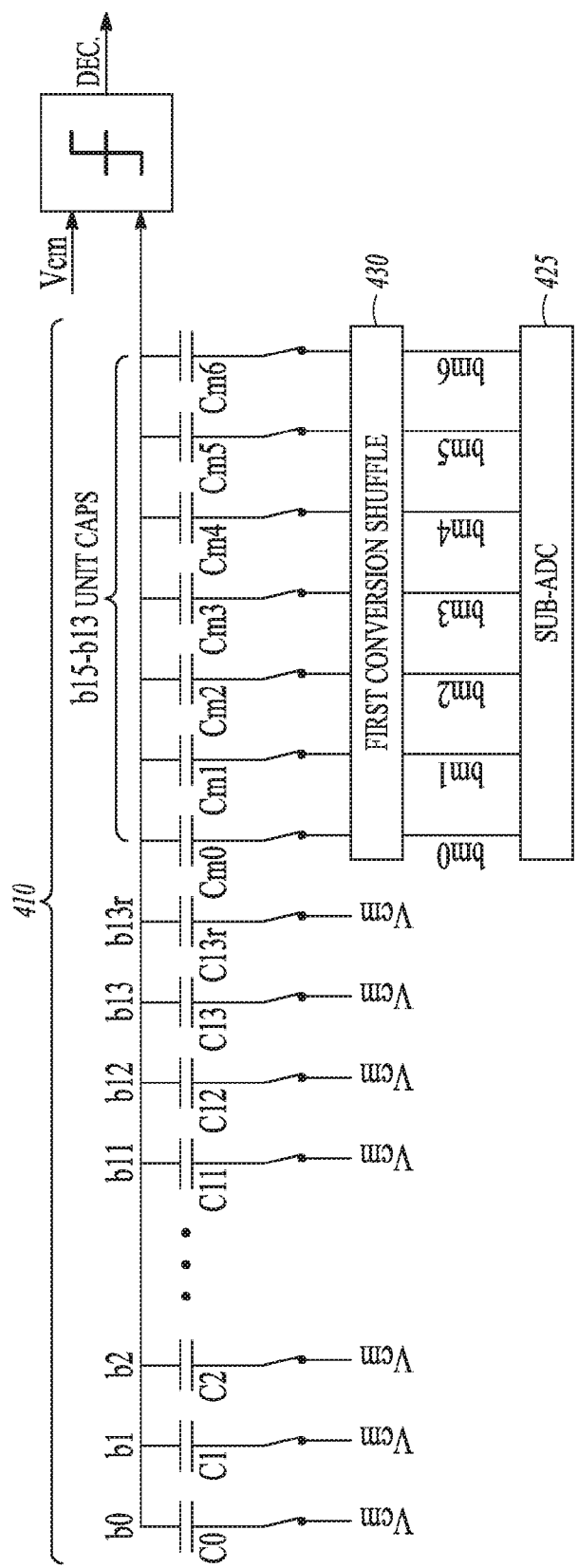
FIG. 4 is a circuit diagram of a DAC circuit of an ADC configured in a conversion phase for MSB trials.

FIG. 4 is a circuit diagram of the DAC circuit 410 of the SAR ADC such as configured in the conversion phase for the MSB trial after the sub-ADC 425 has made the MSB decisions. The decisions of the sub-ADC may be shuffled (e.g., such as randomly or pseudo-randomly) before being applied to the MSB capacitors of the DAC circuit. The ADC may include a switch matrix 430 that provides circuit paths from sub-ADC outputs to the thermometer encoding of the MSBs of the DAC circuit. While the MSBs are trialed by the SAR ADC, the remaining least significant bits (LSBs) of the DAC circuit are connected to a common mode voltage Vcm.

Figure 5:
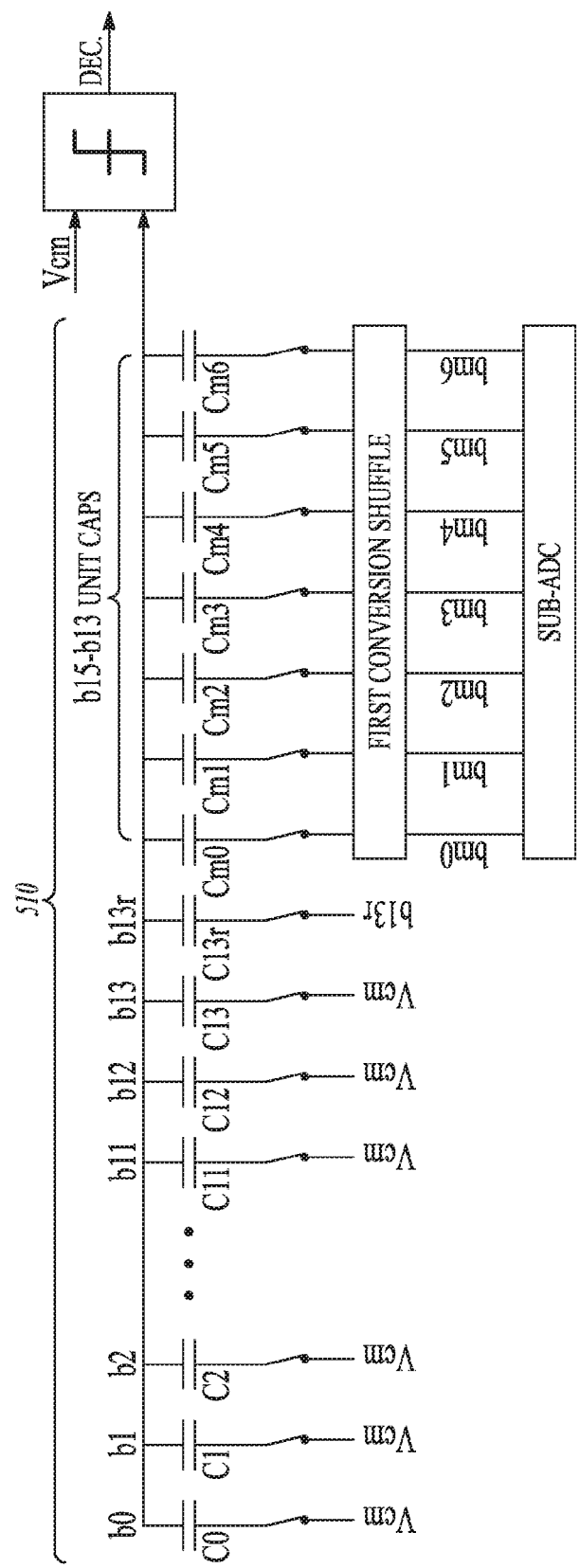
FIG. 5 is a circuit diagram of a DAC circuit of an ADC configured in a conversion phase for a bit trial subsequent to the MSB trials.
Figure 6:
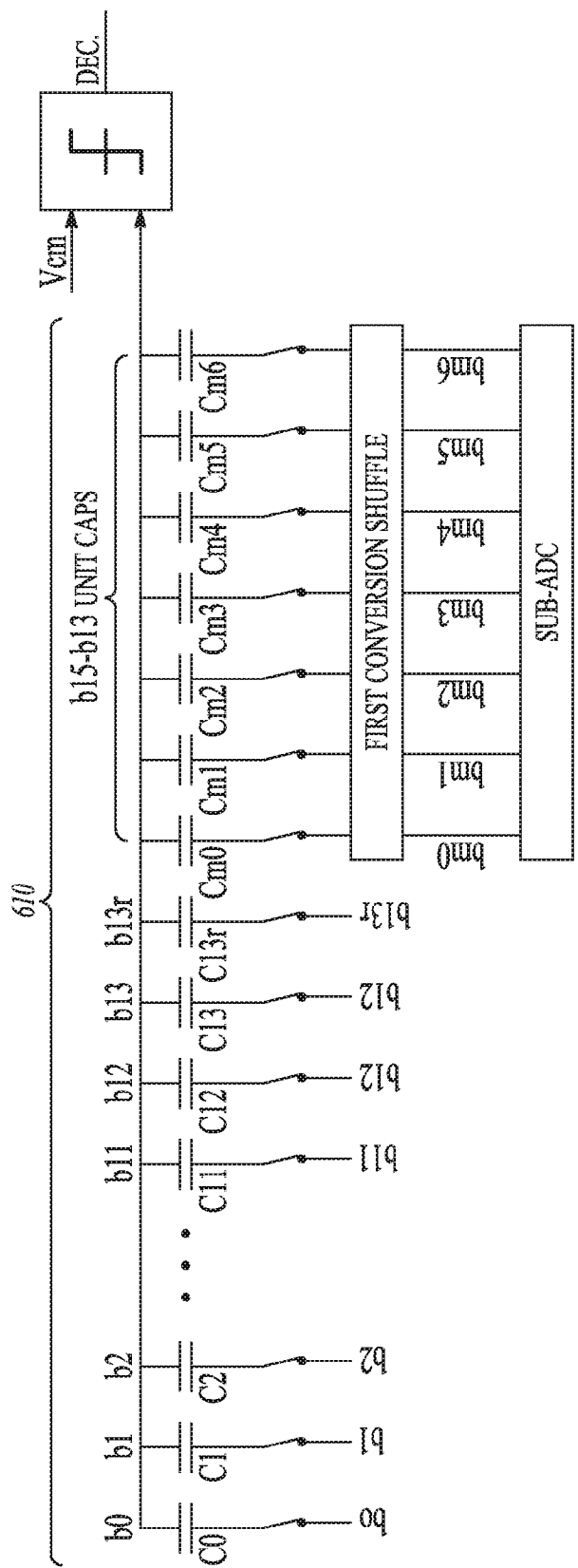
FIG. 6 is a circuit diagram of a DAC circuit of an ADC when conversion is complete.

After the bit trials of the MSBs are complete, the bit trials for the remaining bits of the DAC can be performed. FIG. 5 is a circuit diagram of the DAC circuit 510 of the SAR ADC configured in the conversion phase for the b13r trial subsequent to the MSB trials. FIG. 6 is a circuit diagram of the DAC circuit 610 of the SAR ADC when the first conversion for all of the bits of the DAC circuit is complete.

After the first full conversion of the input voltage is completed, the ADC decision bits are available and can be stored digitally. The SAR ADC can then perform a second conversion for the same sampled input voltage to the ADC before starting the next sampling phase. In the examples of FIGS. 3-6, the top plates of the capacitors of the capacitor array of the DAC circuit are connected to a common circuit node (the node connected to the input of the comparator). In some examples, the top plate circuit node is not driven after the sampling phase, so the sample input voltage's charge remains held despite changes to the connections of the bottom plates of the capacitors. This allows more than one conversion to be performed for the same sampled input voltage.

At the start of the second conversion, the capacitor bottom plates can be reset to Vcm, which is the same condition as the start of the first conversion. The bit decisions at the output of the sub-ADC from the first conversion can be reused, but can be reshuffled before they are applied to the MSB unit capacitors for the second conversion. In this way, a different set of MSB unit capacitors can be chosen for the sub-ADC decision ones and zeros, and when the MSB unit caps are intentionally sized differently from each other, the second conversion will take a different path to reach bit decisions for the same ADC input voltage.

Figure 7:
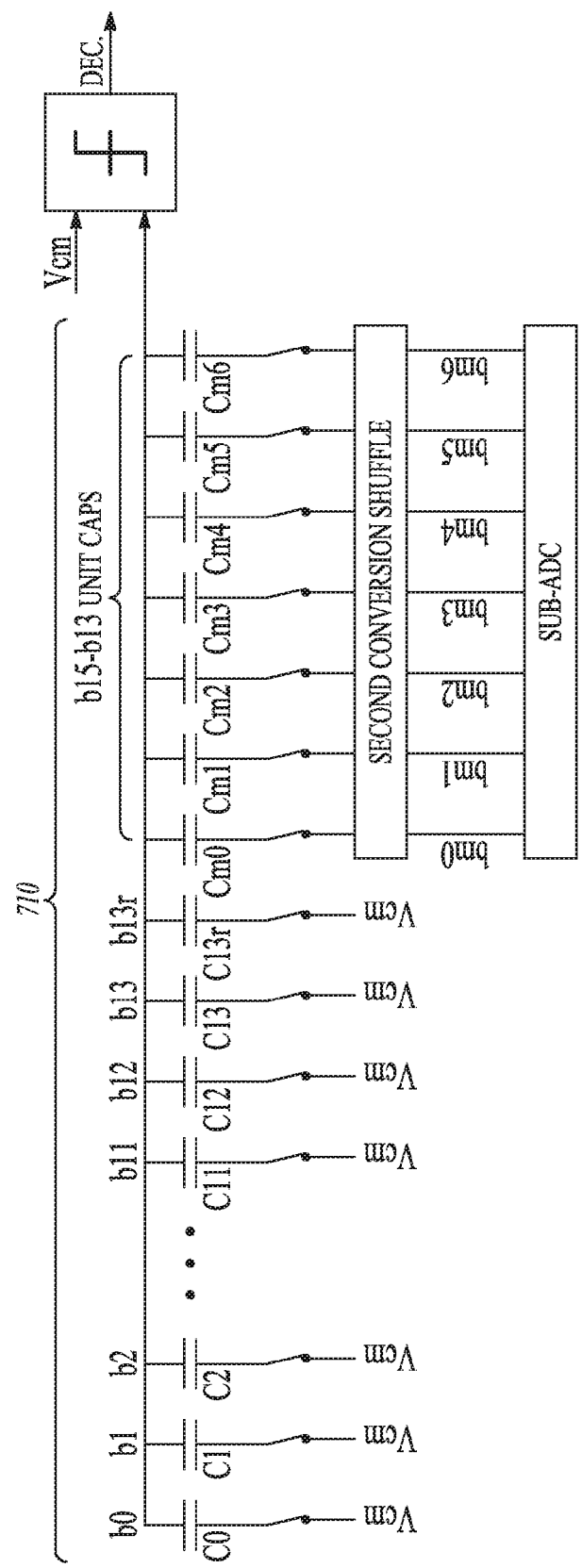
FIG. 7 is a circuit diagram of a DAC circuit of an ADC configured for the MSB trial phase of a second conversion.
Figure 8:
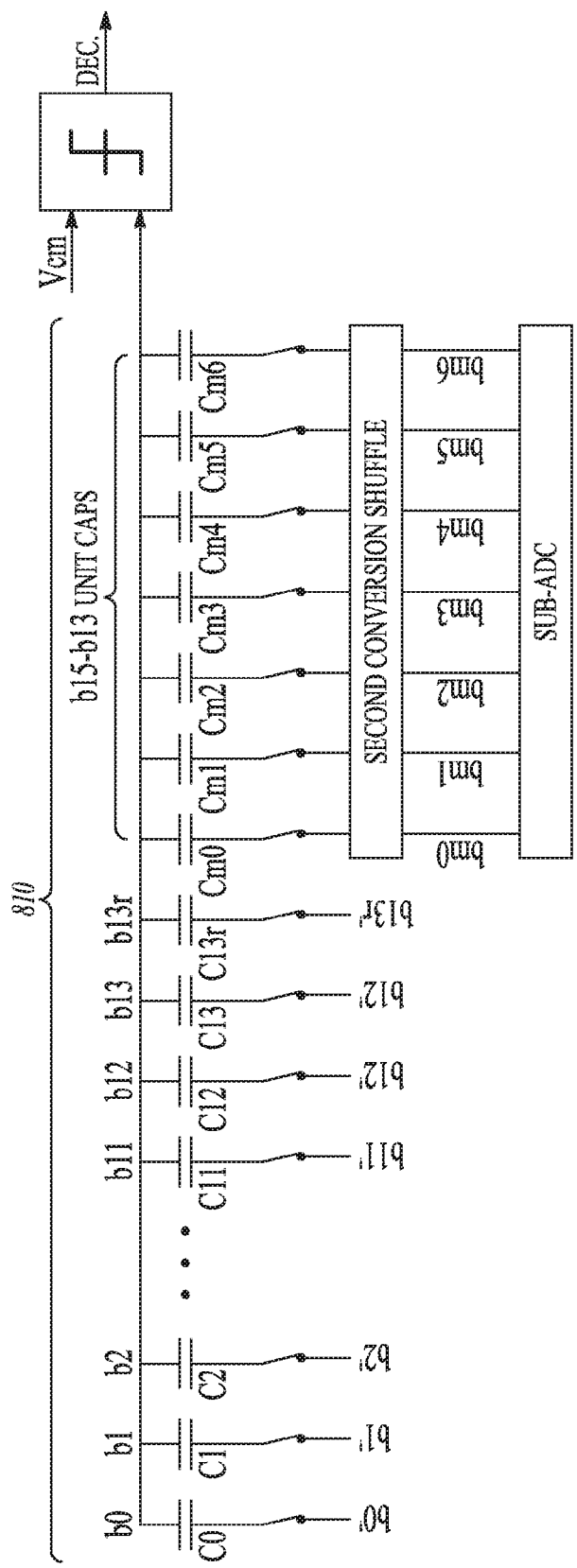
FIG. 8 is a circuit diagram of a DAC circuit of an ADC after bit trials for the second conversion are completed.

FIG. 7 is a circuit diagram of the DAC circuit 710 of the SAR ADC configured for the MSB trials of the second conversion phase, with the outputs of the sub-ADC connected to the MSB capacitors using a second shuffling and all of the LSBs reset to Vcm. FIG. 8 is a circuit diagram of the DAC circuit 810 of the SAR, ADC after the bit trials for the second conversion are completed. The LSB decisions are labeled as b13r' to b0 ' to indicate that the LSB decisions of the second conversion are different from the bit decisions of the first conversion because the sub-ADC bit decisions were re-shuffled before being applied to the MSB unit capacitors, which were intentionally mismatched.

As long as the MSB unit capacitors are mismatched a small amount, once the sub-ADC decisions are shuffled, bits b13r to b0 will sometimes make different decisions between the two conversions of the same input voltage sample. In addition, ADC noise will help here as well. To significantly improve the calibration time, the MSB unit capacitors can be intentionally sized to be off by as much as ~20% peak-to-peak, given that there is the b13r redundancy. For instance, if the nominal MSB capacitance is 1C (a unit capacitance), in an extreme case we could intentionally off-size the seven MSB capacitors as 0.88C, 0.92C, 0.96C, 1C, 1.04C, 1.08C, and 1.12C.

The values of capacitance can be very rough. In the worst case, the sub-ADC decides 0000111 for the MSB encoding with the three smallest MSB caps chosen as ones, and the total capacitance will be off by (−0.12−0.08−0.04−(0.04+0.08+0.12))C=−0.48C.

This error can be covered by using redundant b13r, which provides +/−0.5C redundancy. In practice, only a fraction of the b13r redundancy is used by sizing MSB unit caps closer to each other, which leaves some redundancy for the potential sub-ADC decision errors.

To further randomize or pseudo-randomize the decision paths for the two conversions, a small amount of dither voltage (e.g., a small random or pseudo-random noise voltage) can be applied to the sub-ADC and a second sub-ADC decision can be performed for the second conversion of the same input voltage sample, with a different dither value in the second conversion. The amount of dither applied should be within the tolerance provided by the b13r redundancy.

The examples above describe operation of an ADC circuit with a separate standalone sub-ADC, However, according to some examples, the sub-ADC can include a re-used portion of the full or main ADC circuit. The ADC circuit may be linearly scaled or linearly weighted. A linearly scaled portion of the ADC circuit can be used as the sub-ADC is used to resolve the k most significant bits (MSBs) of the N-bit values, and then can be re-used during the main portion of the conversion.

Once the two ADC conversion outputs from different decision paths are obtained for the same input signal, the calibrated bit weights can be derived either numerically or analytically, such as described previously. In some examples, the logic circuitry averages the first set of N-bit values and the second set of N-bit values to determine the final N-bit digital value. The logic circuitry can include a digital engine to determine the bit weights. The digital engine may include a logic state machine or may include a specialized processor configured by one or more hardware circuits and firmware to perform the functions described. The digital engine may be configured to drive the difference of the output of the two conversion to near zero while adjusting the weights of the N-bits to get the actual calibrated bit weights for the ADC circuit. In some examples, the digital engine calculates least mean squares to converge the first and second sets of N-bit values to the N-bit final values. In some examples, the digital engine determines the calibration in the background while the ADC performs conversions according to normal operation.

An advantage of the one sample, two conversion approach over conventional split ADC calibrations is that the number of bit weights to be calibrated can be halved, which can help to reduce the calibration time and further simplifies the digital engine used to converge the solution. Furthermore, only one ADC circuit need be used for the calibration.

The second conversion increases the ADC conversion time, but the two conversion results can be averaged to bring down conversion noise by three decibels (3 dB), so the Figure of Merit (FoM) roughly stays the same. The exact impact of the additional conversion also depends on the ratio between sampling noise and conversion noise, and ratio of sampling time and conversion time. The overall FoM should be similar to traditional one sample one conversion ADCs, assuming that one or more of the sample noise, sample time, conversion noise, and conversion time are reasonably partitioned. Also, the background calibration technique doesn't have an area penalty over a single conversion solution. Further, the extra conversion may be transparent to the user, who only sees it as a regular one analog input and one digital output ADC because the ADC only samples the input once to produce one aggregated digital output, In certain examples, the two conversions of the single sampled input voltage is performed recurrently or continuously as the ADC circuit operates. In certain examples, the first conversion is performed as part of normal operation of the ADC circuit and the second conversion is performed recurrently at specified times, such as according to a specified schedule.

In some examples, more than two conversions can be performed. The logic circuitry may initiate P conversions of the sampled input voltage to generate P sets of N-bit values, where P is a positive integer greater than 2. The final N-bit digital value can be determined using the P sets of N-bit values. The logic circuitry may determine the final values using averaging of the P results or least mean squares to converge the P sets of N-bit values to the N-bit final values.

The previous descriptions of the SAR ADCs are used only as examples. Other implementation examples may be fully differential and a differential input voltage is sampled, compared, and converted. In some examples, the weighting of the circuit components is non-radix 2 (e.g., radix 1.9 or radix 1.7). In sonic examples, the ADC input can be sampled onto two sampling capacitor arrays, the first conversion uses one capacitor array and the second conversion uses the second capacitor array. This would reduce the total sampling noise but at a cost of doubling the circuit area of the capacitor array and associated switching circuitry. Another variation is to use dither for the main DAC capacitor array to create random decision paths.

Although, the background calibration techniques have been described in terms of SAR ADC, the ADC background calibration with dual conversions also applies to any ADC that has associated bit weights (e.g., pipelined ADC, SAR ADC, flash ADC, etc.) where the ADC input is sampled once, converted at least twice with different decision paths, and the results processed to calibrate the ADC bit weights. The different decision paths can be enabled using randomization (or pseudo-randomization) and ADC redundancy. The several examples of systems, devices, and method described can be used to provide a calibrated ADC circuit for an electronic system while avoiding the disadvantages of a foreground calibration approach and disadvantages of a conventional background calibration approach.

To recap and further explain, the same analog input value can be sampled and converted to digital at least twice with at least one different decision path between the two conversions, and the resulting error between the two conversions can be driven to zero, such as to calibrate or correct the ADC for subsequent analog-to-digital conversions. The different decision paths can be induced by capacitor shuffling, dithering, or the like, or a combination of such techniques.

For example, to calibrate or compensate or correct for capacitor bit weight errors, a convenient approach is to apply a different shuffle sequence (or shuffle code) during the second analog-to-digital conversion of the same input signal value. The shuffling can be of all N bits, or of k MSBs of these N bits. However, when the input signal is close to full scale, the shuffler bits (e.g., k MSBs) can be all ones, and when the input signal is close to zero, the shuffler bits (e.g., k MSBs) can be all zeros, such that shuffling may not change at least one decision path between the first and second analog-to-digital conversions of the same input signal value.

A technique for providing more effective shuffling that can change at least one decision path even when the input signal is close to full scale or zero is to include at least one redundant element (e.g., capacitor) in the shuffler, and trial the at least one bit associated with the at least one redundant element. Including more redundant elements will provide more signal margin even when all shuffler bits are driven to ones or all shuffler bits are driven to zeros.

Additionally or alternatively, two extra elements (e.g., capacitors) can be added into the shuffler, and set to opposite values during sampling, for example, by driving one of the extra elements with a logic "one" during sampling of the input signal, and driving the other of the extra elements with a logic "zero" during the sampling of the input signal. This can ensure that there is at least one element in the shuffler that is driven to a different logic value than the other elements in the shuffler, e.g., even when the signal is at or near full scale or zero. In this way, when the shuffler elements are shuffled between the first and second analog-to-digital conversions, at least one decision path of the second analog-to-digital conversion will be different from the first analog-to-digital conversion.

Shuffling of weighted elements (e.g., capacitors) between conversions of the same input voltage in this way can be an effective way to initially or periodically or recurrently calibrate or compensate or correct an ADC circuit, such as in the background, by driving a resulting difference between the conversions to zero to obtain a calibration correction value to apply to subsequent analog-to-digital conversions of subsequent input voltages samples. In a SAR ADC circuit using capacitors as weighted elements for bit trials for SAR analog-to-digital conversion, all of these capacitors (instead of only the k MSBs) can be included in the shuffler for shuffling between conversions of the same input voltage for calibration purposes. However, the number of capacitor elements will grow exponentially with the resolution of the ADC, which can make it difficult or costly to design such a complete shuffler. Therefore, a limited number (k) of MSBs can be shuffled instead.

When the shuffled capacitors in the SAR ADC are not intentionally misweighted, the shuffling of the k MSBs will not change the bit trial residue of the shuffled capacitors, between conversions of the same input voltage, before performing bit trials of the non-shuffled (N-k) LSB capacitors. In this case, the lower (N-k) LSB capacitors start their bit trial from the same bit trial residue of the shuffled capacitors of the k MSBs. Therefore, the first conversion and the second conversion will have a very similar decision path or decision result for the lower (N-k) LSB capacitors, such as with only a slight difference due to comparison noise. This makes it difficult to calibrate the lower (N-k) bits. This can be improved such as by intentionally misweighting the shuffled capacitors or applying a random or pseudo-random dither between the first and second analog-to-digital conversions, or both.

For example, applying a random or pseudo-random dither between the first and second analog-to-digital conversions can effectively serve as an analog offset. Because of this randomized offset, there will be a randomized residue voltage when starting bit trials for non-shuffled (N-k) lower bits during the second analog-to-digital conversion. This will make the second analog-to-digital conversion have a different decision path or decision result. A separate dither DAC circuit can be used to re-dither in the second analog-to-digital conversion. Randomization or pseudo-randomization can be helped by applying different dither code in first conversion from that applied in the second conversion.

Optionally, additional randomization or pseudo-randomization can include using the same dither DAC or different dither DAC to sample a randomized or pseudo-randomized offset during input voltage sampling. Dither sampled together with the input voltage during sampling phase can include using the non-sampling capacitors (e.g., lower bits capacitors that are not used for sampling the input signal). These non-sampling capacitors can be reset (e.g., to a common mode voltage, VCM) after sampling the input voltage and before initiating bit trials. However in order to provide a different dither in the second analog-to-digital conversion without re-sampling the input voltage, a separate dither DAC can be provided, which need only used for dithering, rather than using a dual-purpose DAC for both dithering and bit trial decisions.

When the shuffled capacitors in the SAR ADC are intentionally misweighted, during the second analog-to-digital conversion, an extra incremental offset can be generated by the shuffling, such that the lower bit trials have a different decision path, at least when the input signal is time-varying and not constant. It is possible that the incremental offset due to shuffling might not be enough to make higher-order bits in the SAR capacitor array have different decision results for a constant input signal. By dithering instead of or in addition to, shuffling, a more significant incremental offset can be applied, which can work well even for a constant input signal voltage. Moreover, when dither is combined with shuffling (e.g., with the first dither bit weight being the half weight of shuffle element), dither and shuffle together can compensate ADC linearity even if the calibration has not converged perfectly, such that noise is still present. When the calibration converges, noise will also diminish.

Figure 9:
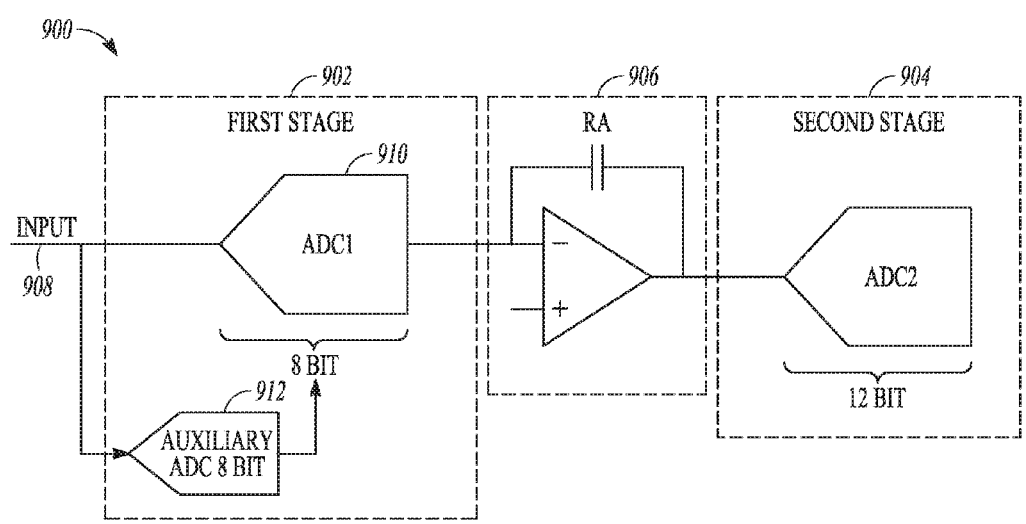
FIG. 9 shows an illustrative non-limiting example of a pipelined or split ADC system.

FIG. 9 shows an illustrative non-limiting example of a pipelined or split ADC system 900. The ADC system 900 can include a first-stage ADC circuit 902 and a second-stage ADC circuit 904. An amplifier circuit 906 or other buffer circuit can be used between the first-stage ADC circuit 902 and the second-stage ADC circuit 904. The first-stage ADC circuit 902 can receive an input voltage at node 908, such as from a sampling circuit 205 that can be included in or coupled to the ADC system 900. The sampling circuit 205 can sample the same input voltage for first and second conversions into corresponding first and second N-bit digital values. The first-stage ADC circuit 902 can convert the most-significant k-bits of the N-bit digital value, and can provide a resulting first residue (e.g., via the amplifier circuit 906) to the second-stage ADC circuit 904, which can convert the first residue into the remaining N-k bits of the N-bit digital value.

For generating the first and second conversions of the same input voltage, the second stage ADC circuit 904 can be configured to perform at least two different second-stage analog-to-digital conversions on the first residue, each of which can be combined with the first-stage conversion to yield two separate N-bit digital values corresponding to such first and second analog-to-digital conversions of the same input voltage. By driving a difference between the resulting first and second N-bit digital values to zero using a digital engine, background calibration can be performed to obtain calibration bit weights for use in subsequent analog-to-digital conversions, as explained herein.

The two different second-stage analog-to-digital conversions can include different decision paths. The different decision paths in the second-stage analog-to-digital conversions can result from one or more of various techniques, such as dithering, shuffling weighted circuit components (e.g., capacitors). Such dithering or shuffling can be performed in the second-stage ADC circuit 904, in the first-stage ADC circuit 902, or in both. For example, the different second-stage decision paths can result from MSB shuffling of at least some of the k MSBs being converted in the first stage ADC circuit 902, such as between first and second first-stage analog-to-digital conversions of the same input voltage into a pair of respective instances of k MSBs and corresponding pair of first residues.

In the example of FIG. 9, the first stage ADC circuit 902 can include a primary ADC circuit 910 and an auxiliary ADC circuit 912. The primary ADC circuit 910 can include at least k weighted circuit components (e.g., capacitors), such as can be used to obtain the k MSBs and the first residue. Bit values for the weighted circuit components of at least some of these k MSBs can be determined by the auxiliary ADC circuit 912. For example, where the primary ADC circuit 910 (e.g., a SAR ADC circuit using a DAC circuit and a comparator circuit) performs its analog-to-digital conversion more slowly than the auxiliary ADC circuit 912 (e.g., using an ADC architecture that can be optimized for speed), then it may be advantageous to determine at least initial bit values for the weighted circuit components of some or all of the k MSBs of the first-stage ADC 902 using the auxiliary ADC circuit 914.

Figure 10A:
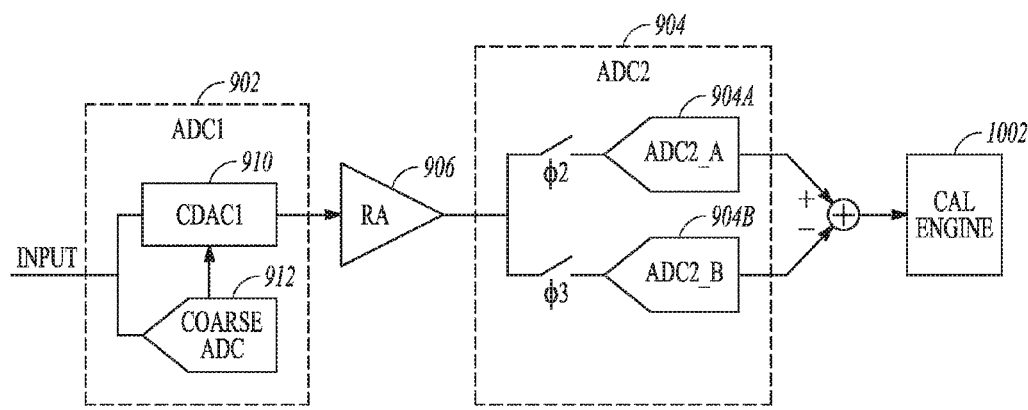
FIG. 10A shows an example, similar to that of FIG. 9, but in which the second-stage ADC circuit can include separate second-stage ADC circuits, such as for performing first and second second-stage analog-to-digital conversions in parallel.

FIG. 10A shows an example, similar to that of FIG. 9, but in which the second-stage ADC circuit 904 can include separate second-stage ADC circuits 904A-B, such as for performing first and second second-stage analog-to-digital conversions in parallel, such as either at least partially concurrently or sequentially. This can involve converting separate first and second first-stage residues from the same input voltage, such as where dithering or shuffling is applied between two different first-stage analog-to-digital conversions of the same input voltage to produce the separate first and second first-stage residues. In another example, this can involve converting the same first-stage residue using different decision paths in the second-stage conversion, such as with dithering or shuffling applied in the second-stage ADC 904, such as to produce at least one different decision path within second-stage ADC 904A from second-stage ADC 904B. By driving a difference between the resulting first and second N-bit digital values toward zero or a constant value, such as using a digital engine 1002, background calibration can be performed to obtain calibration bit weights for use in subsequent analog-to-digital conversions, as explained herein.

Figure 10B:
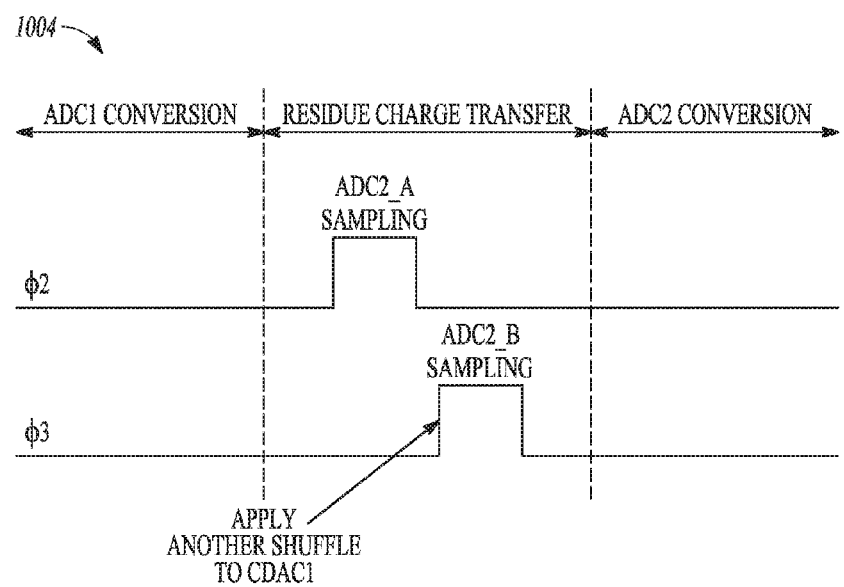
FIG. 10B shows a sampling and conversion timing diagram for the second-stage ADC circuits in FIG. 10A.

FIG. 10B shows a sampling and conversion timing diagram 1004 for the second-stage ADC circuits 904A-B in FIG. 10A.

Figure 11:
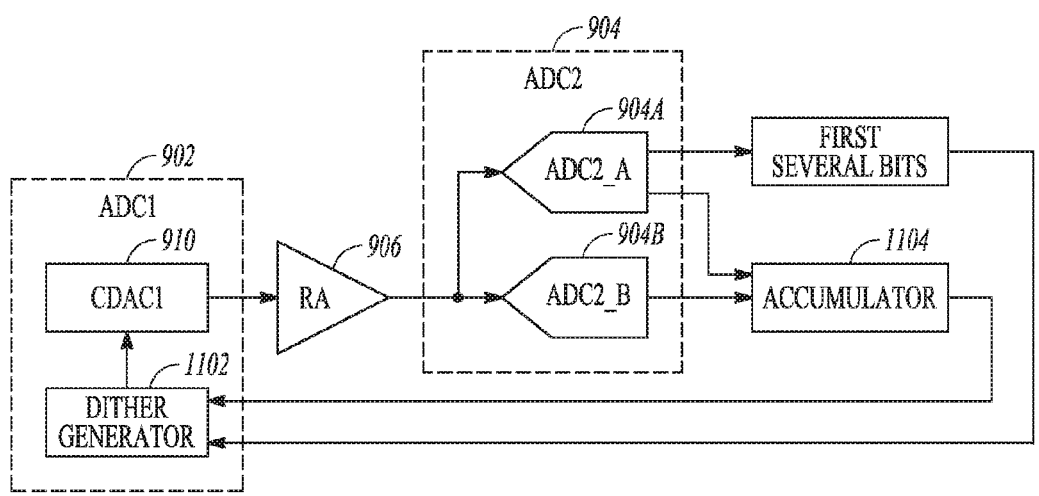
FIG. 11 shows an example, similar to that of FIG. 10, in which a dither generator circuit can be included in or coupled to the first-stage ADC circuit, such as to apply a dither to the primary ADC circuit in the first-stage ADC circuit.

FIG. 11 shows an example, similar to that of FIG. 10A, in which a dither generator circuit 1102 can be included in or coupled to the first-stage ADC circuit 902, such as to apply a dither to the primary ADC circuit 910 in the first-stage ADC circuit 902. The dither signal can be sampled together with the input signal, or the input signal can be sampled and then the dither can be applied later. The value of the sampled or later-applied dither signal can be generated as follows. The digital output values of the second-stage ADC 904A can be accumulated, such as using an accumulator circuit 1104. The dither signal can be generated based on the accumulator output, such as in a closed-loop fashion to make the accumulator circuit 1104 output approach zero over time. This can help provide first order noise shaping. The first several bits of the ADC 904A can also be used as an input signal to the dither generator circuit 1102.

In a specific example, a second-stage dither value can be generated based on a first stage residue, such as can be output by the residue amplifier 906. Gain error in the residue amplifier 906 can be a source of linearity error in the overall analog-to-digital conversion. The amount of error can be expressed as error=(gain_error)·(residue_voltage), where residue_voltage can represent the voltage measured at an output of the residue amplifier 906. Error is proportional to residue_voltage. However if the residue_voltage is zero, the error will be zero. When information about the first residue voltage becomes available after the analog-to-digital conversion by the first-stage ADC circuit 902, then separate dithers of opposite signs can be applied during the first and second conversions by the second-stage ADC circuit 904, such that the average of the two residue voltages produced by the second-stage ADC circuit 904 approaches zero. How well this can be achieved can depend on the resolution of a dither DAC circuit being used to apply the dither during the first and second analog-to-digital conversions by the second-stage ADC circuit 904.

There are several techniques that can be used to do this. For example, several bit trials can be run in the first conversion by the second-stage ADC circuit 904 to determine the first several hits, which can be used to apply dither to the primary ADC 910 in the first-stage ADC circuit 902. In an example, after the first conversion by the second-stage ADC circuit 904 has completely finished, to get more resolution, the same second stage ADC circuit 904A-B can be re-used for a second analog-to-digital conversion using the second-stage ADC circuit 904. In an example, a fast auxiliary ADC circuit 912 (e.g., a flash ADC) can be used to give an analog-to-digital conversion result of the first-stage ADC circuit 902, which can be used to generate dither values for both first and second second-stage analog-to-digital conversions by the second-stage ADC circuit 904.

After both the first and second second-stage analog-to-digital conversions by the second-stage ADC circuit 904 have been completed, these two results can be averaged. If this averaged result is not zero, the non-zero error can be accumulated, such as into an accumulator circuit 1104. For the next analog-to-digital conversion, the value of this accumulated error can be subtracted from the second-stage dither value. By doing this, the error resulting from the residue amplifier circuit 906 will approach zero over time, such as in a time average manner.

It should be noted that the averaged result of the first and second second-stage analog-to-digital conversions by the second-stage ADC circuit 904 need not necessarily average to zero but instead, in an example, can average to a constant voltage. A constant error, rather than a signal-dependent error, does not contribute to linearity error in the analog-to-digital conversion.

Figure 12:
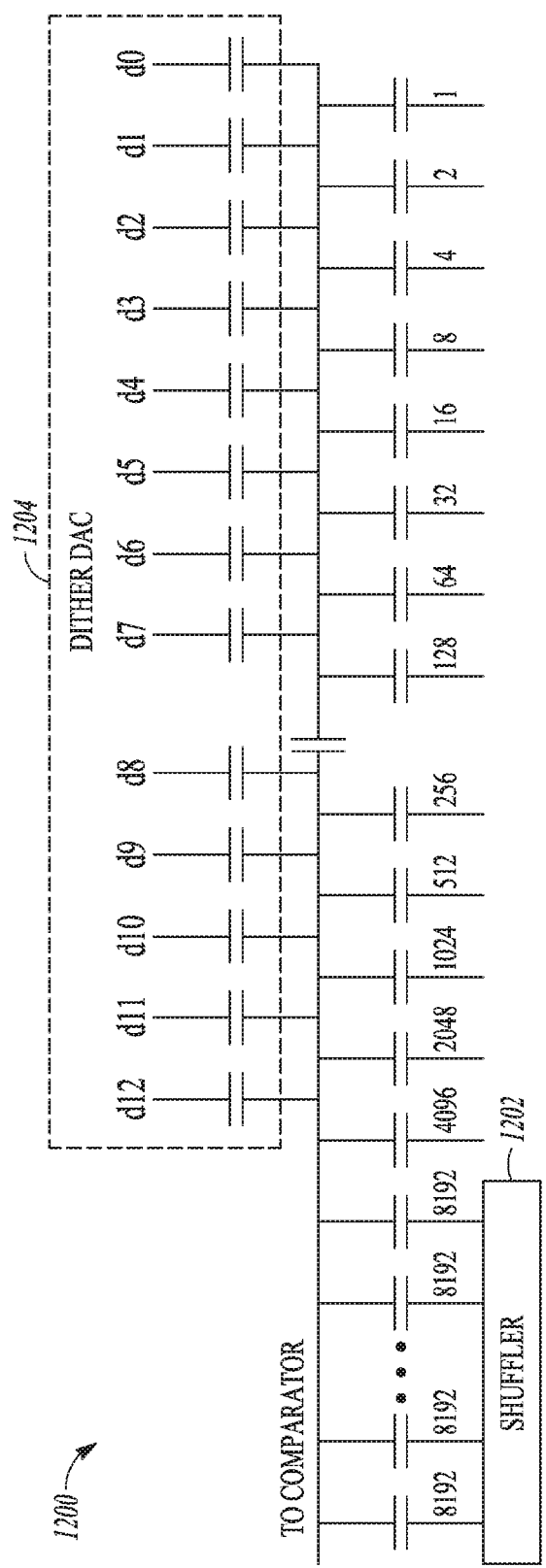
FIG. 12 shows an example of combining shuffling and dithering within the same DAC of an ADC circuit.

FIG. 12 shows an example of combining shuffling and dithering within the same DAC 1200 of an ADC circuit. In this illustrative example, the DAC 1200 can use weighted capacitors to provide weighted circuit components for twice converting the same sample of an input voltage to generate two resulting N=16 bit digital values. In this example, shuffling can be applied to the k=3 MSBs, such as using a shuffler circuit 1202, and dithering can be applied to the 13 LSBs, such as using a dither DAC 1204 of a dither generator circuit. The shuffled capacitors need not be intentionally misweighted, in this example, since re-dithering by the dither DAC 1204 between conversions of the same input voltage can be used to involve different decision paths between such conversions of the same input voltage. The shuffled capacitors can optionally include one or more redundant weighted circuit components, such as a redundant capacitor, e.g., r13 such as shown in FIG. 12. The redundant capacitor can be used to help ensure different decision paths between conversions of the same input voltage even if the shuffler is driven by all ones (e.g., if the input signal is at or near full-scale) or driven by all zeros (e.g., if the input signal is at or near zero). For example, where two redundant capacitors r13A, r13B are included in the shuffled capacitors shuffled by the shuffler 1202, they can be tied to different voltages, e.g., R13A=0, R13B=0), such that it is impossible for the shuffler 1202 to be driven by all ones or driven by all zeros, even if the input signal is at or near full scale or zero.

In operation, the dither DAC 1204 can be reset during acquisition of the input voltage sample, such as by the dither DAC 1204 sampling a common mode voltage VCM, or some other reference DC voltage level. During the first conversion of the input voltage, a first dither DAC code can be applied to the dither DAC 1204. Between the first conversion of the input voltage and the second conversion of the input voltage, the shuffler 1202 can shuffle weighted capacitors associated with the k-MSBs and a second dither DAC code—different from the first dither DAC code—can be applied to the dither DAC 1204, such as by using data-dependent dither code generation instead of randomized dither code generation, for example. Because of the different dithering during the first and second conversions of the same input voltage, the conversions of the same input voltage will include different decision paths. For a pipelined SAR, the approach shown and described with respect to FIG. 12 can be incorporated into each of a first-stage ADC and a second-stage ADC, such as shown in FIGS. 9-11.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An analog-to-digital conversion system comprising:
   a sampling circuit, configured to sample an input voltage for a first conversion into an $N_1$-bit first digital value and to use the same input voltage sample for at least a second conversion into an $N_2$-bit second digital value, wherein $N_1$ and $N_2$ are positive integers greater than zero;
   an analog-to-digital converter (ADC) circuit, including:
      weighted circuit components providing corresponding decision paths;
      a comparator circuit configured to use at least some of the weighted circuit components to compare a signal based upon the sampled input voltage as part of a bit determination for determining bits of the first and second digital values;
      logic circuitry configured to control at least some of the decision paths used in the second conversion to be different from the decision paths used in the first conversion, and wherein at least some of the weighted circuit components and decision paths of the $N_1$-bit values of the first conversion are shuffled from the weighted circuit components and decision paths used to convert the $N_2$-bit values of the second conversion; and
      wherein the logic circuitry includes a digital engine configured to drive a difference between a result of the first conversion and a result of the second conversion toward zero or a finite DC value by adjusting weights of one or more of the weighted circuit components to calibrated values for use in one or more subsequent analog-to-digital conversions of subsequent samples of the input voltage.

2. The system of claim 1, wherein the analog-to-digital converter (ADC) circuit comprises:
   a digital-to-analog (DAC) circuit including the weighted circuit components; and
   wherein the logic circuitry is configured to:
      initiate a first conversion of the sampled input voltage to a first set of $N_1$-bit values using at least $j_1$ bit trials;
      initiate at least a second conversion of the sampled input voltage to a second set of $N_2$-bit values using at least $j_2$ bit trials, wherein at least a portion of the decision paths used in the second conversion are different from the decision paths used in the first conversion; and determine a final digital value for the sampled input voltage using a central tendency of at least both of the first set of $N_1$-bit values and the second set of $N_2$-bit values.

3. The system of claim 1, wherein the digital engine is configured to perform calibration of the ADC circuit in the background while the ADC is in normal operation.

4. The system of claim 1, including redundant weighted circuit components, wherein the logic circuitry is configured to initiate a first conversion of the sampled input voltage to an $N_1$-bit digital value using $j_1$ bit trials including $r_1$ redundant bit trials and a second conversion of the same sampled input voltage to an $N_2$-bit digital value using $j_2$ bit trials including $r_2$ redundant bit trials with a different decision path, and determine a final digital value for the sampled input voltage using a first set of $(N_1+r_1)$-bit values and a second set of $(N_2+r_2)$-bit values.

5. The system of claim 1, wherein the weighted circuit components are intentionally mismatched capacitors included in a capacitor array for shuffling by the logic circuitry, wherein the sampling circuit is configured to apply the input voltage to the capacitor array, and wherein the first conversion and the second conversion are both performed on the input voltage sampled using the capacitor array.

6. The system of claim 1, including a first capacitor array of weighted circuit elements and a second capacitor array of weighted circuit elements, wherein the sampling circuit is configured to apply the same sampled input voltage to weighted components of both the first capacitor array and the second capacitor array, and wherein the logic circuitry is configured to initiate the first conversion of the sampled input voltage to a precision of $N_1$-bits using the first capacitor array, and initiate the second conversion of the sampled input voltage to a precision of $N_2$-bits using the second capacitor array.

7. The system of claim 1, wherein the logic circuitry is configured to add a dither for one or both of the first conversion and the second conversion.

8. The system of claim 7, comprising at least one dither generator circuit configured to provide different dither values during the first and second conversions such that at least a portion of the decision paths used in the second conversion are different from the decision paths used in the first conversion.

9. The system of claim 8, wherein the dither generator circuit is configured to apply a random or pseudo-random dither code to a dither digital-to-analog converter (DAC) circuit during sampling of the input voltage.

10. The system of claim 1, wherein the first conversion is performed as part of normal operation of the ADC circuit and the second conversion is performed recurrently at specified times for calibration of the ADC circuit.

11. The system of claim 1, wherein the analog-to-digital converter (ADC) circuit comprises:
the logic circuitry being configured to:
initiate P conversions of the same sampled input voltage to generate P sets of digital values, wherein P is a positive integer greater than two (P>2), wherein at least a portion of the decision paths used in each conversion are different from each other.

12. The system of claim 1, wherein the ADC circuit includes a successive approximation register analog-to-digital converter (SAR ADC) circuit comprising:
a digital-to-analog (DAC) circuit including weighted capacitors configured to resolve one or more bits per bit-trial.

13. The system of claim 12, wherein the logic circuitry is configured to:
initiate a first conversion of the sampled input voltage to a first set of $N_1$-bit values using at least $j_1$ bit trials; and
initiate a second conversion of the same sampled input voltage to a second set of $N_2$-bit values using at least $j_2$ bit trials, wherein different decision paths enabled by one or both of dithering and bit shuffling are used in the first conversion and the second conversion.

14. The system of claim 12, wherein the SAR ADC circuit includes redundant weighted capacitors, wherein the logic circuitry is configured to initiate a first conversion of the sampled input voltage to an $N_1$-bit digital value using $j_1$ bit trials including $r_1$ redundant bit trials and a second conversion of the sampled input voltage to an $N_2$-bit digital value using $j_2$ bit trials and $r_2$ redundant bit trials, and determine a final digital value for the sampled input voltage using a first set of $(j_1)$-bit values and a second set of $(j_2)$-bit values.

15. The system of claim 1, further including a separate auxiliary ADC circuit configured to resolve k most significant bits (MSBs) of the $N_1$-bit values, wherein k is a positive integer greater than or equal to one and less than $N_1$ ($1 \le k < N_1$).

16. The system of claim 15, wherein the auxiliary ADC circuit is configured to generate a thermometer encoding for the k MSBs.

17. The system of claim 15, wherein different dither is applied to one or both of MSBs and LSBs between the first conversion and the second conversion.

18. The system of claim 1, wherein the shuffler includes at least one redundant weighted circuit component that is included in the weighted circuit components being shuffled.

19. The system of claim 1, wherein the shuffler further includes at least two additional weighted circuit components having the same weight and coupled to opposite digital values during shuffling to preclude the shuffler being stuck with all like digital values during calibration.

20. An analog-to-digital conversion system comprising:
a sampling circuit, configured to sample an input voltage for a first conversion into a first digital value and to use the same input voltage sample for at least a second conversion into a second digital value;
an analog-to-digital converter (ADC) circuit, including:
a first-stage ADC circuit, configured to receive the sampled input voltage and to initiate a first-stage analog-to-digital conversion, using at least L bit determinations, of L most significant bits (MSBs); and
at least one second-stage ADC circuit, configured to receive at least one residue voltage, remaining from the first-stage analog-to-digital conversion, from the first-stage ADC circuit, and to perform at least two second-stage analog-to-digital conversions, each using at least one different configuration during bit determinations in the respective at least two second-stage analog-to-digital conversions to calibrate the analog-to-digital converter circuit.

21. The system of claim 20, wherein the first-stage ADC is configured to initiate first and second first-stage analog-to-digital conversions, with at least some weighted circuit components and decision paths of k MSBs shuffled therebetween, to produce corresponding first and second residue voltages; and
wherein the second-stage ADC is configured to respectively perform individual ones of the at least two second-stage analog-to-digital conversions upon the corresponding individual ones of first and second residue voltages.

22. The system of claim 21, wherein the first stage-ADC includes or is coupled to a dither generator circuit that is configured to further apply a dither during at least one of the first and second first-stage analog-to-digital conversions to produce at least one of the first and second residue voltages.

23. The system of claim 20, wherein the at least one different configuration used in the two second-stage analog-to-digital conversions is provided by two separate analog-to-digital conversion circuits included in the at least one second stage ADC.

24. The system of claim 20, wherein the first-stage ADC circuit further includes an auxiliary analog-to-digital converter, configured to carry out at least some of the L-bit determinations and to feed at least some of the L-bit values to at least L weighted circuit components of the first-stage ADC circuit for producing the at least one residue voltage, remaining from the first-stage analog-to-digital conversion.

25. The system of claim 20, comprising a shuffler configured to shuffle at least some of the weighted circuit components of at least one of the first-stage ADC or the second-stage ADC between the first and second conversions.

26. The system of claim 25, wherein the shuffler includes at least one redundant weighted circuit component that is included in the weighted circuit components being shuffled.

27. The system of claim 26, wherein the shuffler further includes at least two additional weighted circuit components having the same weight and coupled to opposite digital values during shuffling to preclude the shuffler being stuck with all like digital values during calibration.

28. The system of claim 20, wherein separate dithers are applied during the first and second conversions by the second-stage ADC circuit, such that the average of the two residue voltages produced by the second-stage ADC circuit approaches zero.

* * * * *

UNITED STATES PATENT AND TRADEMARK OFFICE
CERTIFICATE OF CORRECTION

PATENT NO. : 9,608,655 B1  
APPLICATION NO. : 15/170051  
DATED : March 28, 2017  
INVENTOR(S) : Li et al.

Page 1 of 1

It is certified that error appears in the above-identified patent and that said Letters Patent is hereby corrected as shown below:

On page 2, in Column 1, under "Other Publications", Line 4, delete "(SarnpTA" and insert --(SampTA-- therefor In Column 15, Line 11, in Claim 4, delete "hit" and insert --bit-- therefor In Column 15, Line 12, in Claim 4, delete "hit" and insert --bit-- therefor Signed and Sealed this  
Thirty-first Day of July, 2018

Andrei Iancu  
*Director of the United States Patent and Trademark Office*